(12) United States Patent
Nishimata et al.

(10) Patent No.: US 10,829,688 B2
(45) Date of Patent: Nov. 10, 2020

(54) ALUMINATE FLUORESCENT MATERIAL AND LIGHT EMITTING DEVICE

(71) Applicant: NICHIA CORPORATION, Anan-shi (JP)

(72) Inventors: Kazuya Nishimata, Anan (JP); Tomokazu Yoshida, Anan (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/516,944

(22) Filed: Jul. 19, 2019

(65) Prior Publication Data

US 2019/0338184 A1  Nov. 7, 2019

Related U.S. Application Data

(63) Continuation of application No. 16/116,871, filed on Aug. 29, 2018, now Pat. No. 10,619,094.

(30) Foreign Application Priority Data

Aug. 31, 2017  (JP) .................................. 2017-167130
Aug. 17, 2018  (JP) .................................. 2018-153731

(51) Int. Cl.
*H01L 33/50* (2010.01)
*C09K 11/77* (2006.01)
*G02F 1/13357* (2006.01)

(52) U.S. Cl.
CPC ........ *C09K 11/7734* (2013.01); *H01L 33/502* (2013.01); *G02F 1/1336* (2013.01); *G02F 2001/133614* (2013.01); *H01L 33/504* (2013.01)

(58) Field of Classification Search
CPC ............ C09K 11/7734; C09K 11/7731; H01L 33/502; H01L 33/504; G02F 2001/133614; G02F 1/1336
See application file for complete search history.

(56) References Cited

U.S. PATENT DOCUMENTS

| | | | | |
|---|---|---|---|---|
| 5,879,586 A * | 3/1999 | Kitamura | ........... | C09K 11/7734 252/301.4 R |
| 7,649,310 B2 ‡ | 1/2010 | Ishii | ................... | C09K 11/7734 313/50 |
| 7,936,418 B2 ‡ | 5/2011 | Ishii | ................... | C09K 11/7734 349/61 |
| 8,242,528 B2 ‡ | 8/2012 | Berben | .............. | C09K 11/7734 257/10 |
| 8,344,407 B2 ‡ | 1/2013 | Inoue | ................... | H01L 33/508 257/98 |
| 8,450,922 B2 ‡ | 5/2013 | Hirrle | ...................... | H01J 61/44 252/30 |
| 8,471,283 B2 | 6/2013 | Ishii et al. | | |
| 9,039,218 B2 | 5/2015 | Ishii et al. | | |
| 2001/0054708 A1* | 12/2001 | Ono | ...................... | C09K 11/641 252/301.4 R |
| 2008/0018235 A1 ‡ | 1/2008 | Wang | ................. | C09K 11/7734 313/503 |
| 2008/0106186 A1* | 5/2008 | Ishii | ................... | C09K 11/7734 313/503 |
| 2009/0154195 A1 ‡ | 6/2009 | Ishii | ................... | C09K 11/7734 362/61 |
| 2010/0102250 A1 ‡ | 4/2010 | Li | ...................... | C09K 11/0883 250/459.1 |
| 2010/0270909 A1 ‡ | 10/2010 | Hirrle | ................ | C09K 11/7734 313/48 |
| 2010/0276714 A1 ‡ | 11/2010 | Berben | .............. | C09K 11/7734 257/98 |
| 2011/0006334 A1 | 1/2011 | Ishii et al. | | |
| 2011/0068303 A1 ‡ | 3/2011 | Buissette | ................ | B82Y 30/00 252/301.4 R |
| 2011/0073899 A1 ‡ | 3/2011 | Inoue | .................... | H01L 33/508 257/98 |
| 2012/0119234 A1* | 5/2012 | Shioi | .................. | C09K 11/7734 257/88 |
| 2013/0010456 A1 | 1/2013 | Ishii et al. | | |
| 2014/0055982 A1* | 2/2014 | Tao | ..................... | F21V 33/0052 362/84 |
| 2015/0060926 A1 | 3/2015 | Ishii et al. | | |
| 2017/0226415 A1* | 8/2017 | Buissette | ............. | C09K 11/025 |

FOREIGN PATENT DOCUMENTS

| | | | | | |
|---|---|---|---|---|---|
| JP | 2004155907 | A | ‡ | 6/2004 | |
| JP | 2004155907 | A | | 6/2004 | |
| JP | 2011066229 | A | | 3/2011 | |
| JP | 2011066229 | A | ‡ | 3/2011 | |
| JP | 2011506654 | A | | 3/2011 | |
| JP | 2011506654 | A | ‡ | 3/2011 | |
| JP | 2011506655 | A | ‡ | 3/2011 | |
| JP | 2011506655 | A | | 3/2011 | |
| JP | 2015053368 | A | | 3/2015 | |
| JP | 2015053368 | A | ‡ | 3/2015 | |
| WO | 2006068141 | A1 | | 6/2006 | |
| WO | WO-2006068141 | A1 | ‡ | 6/2006 | ......... C09K 11/7734 |
| WO | 2006076737 | A1 | | 7/2006 | |
| WO | WO-2006076737 | A2 | ‡ | 7/2006 | ......... C09K 11/7734 |
| WO | 2007037339 | A1 | | 4/2007 | |
| WO | WO-2007037339 | A1 | ‡ | 4/2007 | ......... C09K 11/7734 |
| WO | 2009107535 | A1 | | 9/2009 | |
| WO | 2009145259 | A1 | | 12/2009 | |

(Continued)

*Primary Examiner* — Donald L Raleigh
(74) *Attorney, Agent, or Firm* — Hunton Andrews Kurth LLP

(57) ABSTRACT

Disclosed are an aluminate fluorescent material having a high light emission intensity, and a light emitting device using the same. The aluminate fluorescent material includes a composition represented by the following formula (I).

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q < 0.6$, $0.4 < r \leq 0.7$, $8.5 \leq s \leq 13.0$, $0 < t < 0.3$, $0.5 < p+t \leq 1.2$, and $0.4 < q+r \leq 1.1$.

18 Claims, 4 Drawing Sheets

(56) References Cited

FOREIGN PATENT DOCUMENTS

| WO | WO-2009145259 A1 ‡ | 12/2009 | |
|----|------|------|------|
| WO | 2014084379 A1 | 6/2014 | |
| WO | 2015108096 A1 | 7/2015 | |
| WO | WO-2015108096 A1 ‡ | 7/2015 | .............. C08L 33/06 |

\* cited by examiner
‡ imported from a related application

ALUMINATE FLUORESCENT MATERIAL AND LIGHT EMITTING DEVICE

CROSS-REFERENCE TO RELATED PATENT APPLICATION

This is a continuation application of U.S. patent application Ser. No. 16/116,871, filed Aug. 29, 2018, which claims priority to Japanese Patent Application No. 2017-167130, filed on Aug. 31, 2017, and Japanese Patent Application No. 2018-153731, filed on Aug. 17, 2018, the entire disclosures of which are hereby incorporated herein by references in their entirety.

BACKGROUND

Technical Field

The present disclosure relates to an aluminate fluorescent material and a light emitting device. In this specification, the "fluorescent material" is used in the same meaning as a "fluorescent phosphor".

Description of Related Art

Various light emitting devices that emit white light, bulb color light, or orange light by a combination of a light emitting diode (LED) and a fluorescent material have been developed. In these light emitting devices, a desired luminescent color can be obtained according to the principle of light color mixing. As a light emitting device, one that emits white light by combination of a light emitting element to emit blue color as an excitation light source, and a fluorescent material to emit green color and a fluorescent material to emit red color when excited by the light from the light source, is known. Use of these light emitting devices in a broad field of ordinary lightings, in-car lightings, displays, backlights for liquid crystals and others is being promoted.

As a fluorescent material that emits green color for use in light emitting devices, for example, Japanese Unexamined Patent Publication No. 2004-155907 discloses a manganese-activated aluminate fluorescent material having a composition represented by $(Ba, Sr)MgAl_{10}O_{17}:Mn^{2+}$.

However, the manganese-activated aluminate fluorescent material disclosed in Japanese Unexamined Patent Publication No. 2004-155907 emits light having a high light emission luminance through excitation by vacuum ultraviolet rays; and is, when combined with a light emitting element that emits light having a light emission peak wavelength in a range of 430 nm or more and 485 nm or less (hereinafter also referred to as "blue region"), insufficient in light emission luminance.

Consequently, an object of the present disclosure is to provide an aluminate fluorescent material capable of having a high light emission intensity through photoexcitation in the blue region; and a light emitting device using the same.

SUMMARY

The present disclosure includes the following embodiments.

A first embodiment of the present invention relates to an aluminate fluorescent material comprising a composition represented by the following formula (I).

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q < 0.6$, $0.4 < r \leq 0.7$, $8.5 \leq s \leq 13.0$, $0 < t < 0.3$, $0.5 < p+t \leq 1.2$, and $0.4 < q+r \leq 1.1$.

A second embodiment of the present disclosure relates to a light emitting device comprising a fluorescent member containing the aluminate fluorescent material; and an excitation light source.

In accordance with the embodiments of the present invention, an aluminate fluorescent material having a high light emission intensity; and a light emitting device capable of efficiently converting a wavelength of light in the blue region, can be provided.

DETAILED DESCRIPTION

Figure 1:
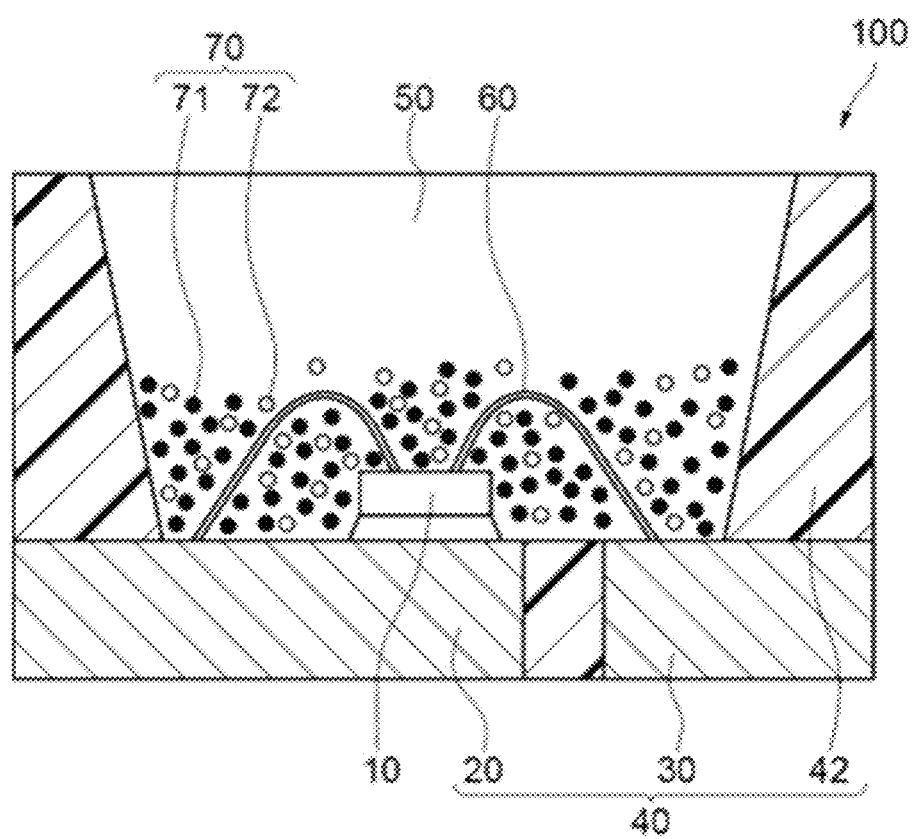
FIG. 1 is a schematic cross-sectional view of a light emitting device according to the present disclosure.

An aluminate fluorescent material and a light emitting device according to embodiments of the present invention will be hereunder described. The embodiments shown below are exemplifications for exemplifying the technical idea of the present invention, and the present invention is not limited to the aluminate fluorescent material and the light emitting device using the same mentioned below. The relationship between the color name and the chromaticity coordinate, the relationship between the wavelength range of light and the color name of monochromic light are in accordance with JIS Z8110.

Aluminate Fluorescent Material

A first embodiment of the present disclosure is an aluminate fluorescent material including a composition represented by the following formula (I). The aluminate fluorescent material preferably has the composition represented by the formula (I).

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q < 0.6$, $0.4 < r \leq 0.7$, $8.5 \leq s \leq 13.0$, $0 < t < 0.3$, $0.5 < p+t \leq 1.2$, and $0.4 < q+r \leq 1.1$, respectively.

In the formula (I), the element $X^1$ preferably contains Ba. In the aluminate fluorescent material, when the element $X^1$ contains Ba in the formula (I), the light emission intensity through photoexcitation in the blue region can be high.

The parameter p in the formula (I) indicates a total molar ratio of at least one element $X^1$ selected from the group consisting of Ba, Sr, and Ca. The term "molar ratio" refers to the molar amount of an element in one mole of the chemical composition of the fluorescent material. When the parameter p does not satisfy $0.5 \leq p \leq 1.0$ in the formula (I), the crystal structure of the aluminate fluorescent material including the composition represented by the formula (I) (hereinafter referred to as "aluminate fluorescent material (I)" in some cases) may be unstable and the light emission intensity may lower. The parameter p is preferably 0.60 or more, more preferably 0.80 or more. The parameter p may be 0.999 or less.

The parameter q in the formula (I) indicates a molar ratio of Mg. When the parameter q in the formula (I) is 0.6 or more, the molar ratio of Mg becomes high so that the amount of Mn or Eu to be an activating element is relatively small, and the light emission intensity of the aluminate fluorescent material (I) tends to be lower. From the viewpoint of stability of the crystal structure and obtaining a high light emission intensity in a desired excitation wavelength region, the parameter q in the formula (I) preferably satisfies $0.05 \leq q \leq 0.55$, more preferably $0.10 \leq q \leq 0.55$. The parameter q in the formula (I) is furthermore preferably 0.15 or more. When the parameter q in the formula (I) satisfies $0 \leq q < 0.6$, the light emission spectrum of the aluminate fluorescent material (I) has a light emission peak wavelength in a range of 510 nm or more and 525 nm or less through photoexcitation in the blue region, and the light emission intensity can be high.

The parameter r in the formula (I) indicates a molar ratio of Mn. Mn is an activating element in the aluminate fluorescent material (I). The aluminate fluorescent material (I) contains both Mn and Eu as activating elements. When the aluminate fluorescent material (I) contains both Mn and Eu, it is presumed that Eu may absorb light to excite electrons by the light in the blue region from the excitation light source, and the resultant excitation energy may be transmitted from Eu to Mn, thereby further contributing to the light emission of Mn. By containing both Mn and Eu as activating elements, the light emission intensity of the aluminate fluorescent material (I) can be increased through photoexcitation in the blue region. In the case where the parameter r is more than 0.7 in the formula (I), the activation amount of Mn is too much and, if so, the aluminate fluorescent material (I) undergoes concentration quenching and the light emission intensity would be thereby lowered. In the formula (I), the parameter r preferably satisfies $0.45 \leq r \leq 0.65$.

The parameter t in the formula (I) indicates a molar ratio of Eu which is an activating element of the aluminate fluorescent material (I). When the parameter t is more than 0.3, the light emission intensity tends to lower. In the case where the parameter t is 0, that is, the aluminate fluorescent material (I) does not contain Eu, the light absorption in the blue region by Eu does not occur, and the excitation energy is not transmitted from Eu to Mn, thereby lowering the light emission intensity of the aluminate fluorescent material by Mn. When the aluminate fluorescent material (I) contains Eu, the light absorption in the blue region becomes large, and a light emitting device using the aluminate fluorescent material (I) can efficiently convert a wavelength of light emitted from a light emitting element. Thus, using the aluminate fluorescent material (I) according to the embodiment of the present disclosure, an amount of the fluorescent material in the light emitting device is reduced, and the light emitting device can be downsized. In the formula (I), the parameter t preferably satisfies $0.001 \leq t \leq 0.250$, more preferably $0.001 \leq t \leq 0.225$, even more preferably $0.001 \leq t \leq 0.200$.

The total of the parameter p and the parameter t in the formula (I) (hereinafter referred to as "p+t" in some cases) indicates a total molar ratio of at least one element $X^1$ selected from the group consisting of Ba, Sr, and Ca; and Eu. When p+t is less than 0.5 or more than 1.2, the crystal structure of the aluminate fluorescent material (I) tends to be unstable and the light emission intensity may therefore lower. p+t is preferably 0.55 or more, more preferably 0.60 or more. Also, p+t is preferably 1.15 or less, more preferably 1.10 or less.

The total of the parameter q and the parameter r in the formula (I) (hereinafter referred to as "q+r" in some cases) indicates a total molar ratio of Mg and Mn. When q+r is 0.4 or less or more than 1.1, the crystal structure of the aluminate fluorescent material (I) tends to be unstable and sufficient light emission intensity may not be obtained. q+r preferably satisfies $0.4 < q+r \leq 1.0$, more preferably 0.5 or more, even more preferably 0.55 or more.

The total of the parameter r and the parameter t in the formula (I) (hereinafter referred to as "r+t" in some cases) indicates a total molar ratio of Mn and Eu as activating elements, and preferably satisfies $0.4 < r+t < 0.8$. When r+t is 0.8 or more, due to concentration quenching occurred, for example, when exciting with light in the blue region, the light emission intensity tends to be lower. In the formula (I), when r+t is 0.4 or less, the activation amount is small and, if so, when the aluminate fluorescent material (I) is excited with light falling in the blue region, light absorption is small and the light emission intensity would be difficult to increase.

The parameter s in the formula (I) indicates a molar ratio of Al. When the parameter s is less than 8.5 or more than 13.0, the crystal structure may be unstable, and if so, when the aluminate fluorescent material (I) is excited with light falling in a near UV to blue region, the light emission intensity tends to lower. In the formula (I), the parameter s preferably satisfies $9.0 \leq s \leq 13.0$. In the formula (I), the parameter s is more preferably 12.0 or less, even more preferably 11.0 or less.

The aluminate fluorescent material (I) may be produced using a flux such as a halide in order to enhance the reactivity of the raw materials. In the case of using a flux containing an alkali metal, a minute amount of the alkali metal element may be detected from the aluminate fluorescent material (I). Even in such a case, the content of the alkali metal element contained in the aluminate fluorescent material (I) is 100 ppm or more and 1,000 ppm or less, may be 200 ppm or more, may be 300 ppm or more, and may be 990 ppm or less. Even in the case where a minute amount of the alkali metal element is detected, the aluminate fluorescent material (I) has the composition represented by the formula (I). Further, in the case of using the halide containing the element constituting the composition represented by the formula (I), the halide is a raw material constituting the aluminate fluorescent material (I), and also acts as a flux. In the case of using both the halide containing the element constituting the composition represented by the formula (I) and the compound, other than the halide, containing the element constituting the composition represented by the formula (I), the halide and the compound other than the halide can be used such that the total of a molar ratio of the element constituting the composition represented by the formula (I), which is contained in the halide, and a molar ratio of the element constituting the composition represented by the formula (I), which is contained in the compound other than the halide, satisfies a molar ratio of each of the elements represented by the formula (I). The element constituting the aluminate fluorescent material (I) may be an element derived from a flux as long as the aluminate fluorescent material (I) satisfies the composition represented by the formula (I).

Average Particle Diameter D

An average particle diameter D of the aluminate fluorescent material (I), which is measured according to a Fisher Sub-Sieve Sizer (FSSS) method, is preferably 10 µm or more. The average particle diameter D of the aluminate fluorescent material (I), which is measured according to the FSSS method, is more preferably 10.5 µm or more. Since the aluminate fluorescent material (I) has a large average particle diameter D of 10 µm or more, the light from the excitation light source can be efficiently absorbed, and the light emission intensity can be further enhanced. The FSSS method is a type of an air permeability method and a method for measuring a specific surface area by utilizing the flow resistance of air to determine a particle diameter. The average particle diameter D according to the FSSS method can be measured using a Fisher Sub-Sieve Sizer Model 95 (manufactured by Fisher Scientific Inc.). It is preferred that the average particle diameter D of the aluminate fluorescent material (I), which is measured according to the FSSS method, is large, but is generally 50 µm or less and preferably 30 µm or less from the viewpoint of the easiness in manufacturing.

Volume Average Particle Diameter D50

A volume average particle diameter D50 of the aluminate fluorescent material (I) at a cumulative volume frequency of 50% from the small-diameter side in the particle size distribution on a volume basis, which is measured by a laser diffraction particle size distribution measuring method, is preferably 10 µm or more, more preferably 12 µm or more, even more preferably 15 µm or more. The laser diffraction particle size distribution measuring method is a method of measuring a particle size irrespective of primary particles and secondary particles by using the scattered light from the laser light radiated to particles. The volume average particle diameter D50 by the laser diffraction scattering particle size distribution measuring method can be measured using a laser diffraction particle size distribution measuring apparatus (Mastersizer 3000, manufactured by Malvern Instruments Ltd.). The closer the values of the average particle diameter D and the volume average particle diameter D50 are, the smaller the number of coagulated particles is. The volume average particle diameter D50 of the aluminate fluorescent material (I) on a volume basis measured by the laser diffraction scattering particle size distribution measuring method is generally 75 µm or less, and preferably 65 µm or less, more preferably 55 µm or less.

Light Emitting Device

An example of a light emitting device according to the second embodiment of the present disclosure is described with reference to the drawing attached hereto. FIG. 1 is a schematic cross-sectional view showing a light emitting device 100 according to the second embodiment of the present disclosure. The light emitting device according to the second embodiment of the present disclosure comprises a fluorescent member containing the aluminate fluorescent material (I) and an excitation light source.

The light emitting device 100 comprises a molded body 40, a light emitting element 10, and a fluorescent member 50. The molded body 40 is constituted by integrally forming a first lead 20, a second lead 30, and a resin part 42 containing a thermoplastic resin or a thermosetting resin. The molded body 40 forms a concave part having a bottom face and a side face, and the light emitting element 10 is mounted on the bottom face of the concave part. The light emitting element 10 has a pair of positive and negative electrodes, and the pair of positive and negative electrodes each are individually electrically connected to the first lead 20 and the second lead 30 each via a wire 60. The light emitting element 10 is covered with the fluorescent member 50. The fluorescent member 50 contains, for example, a fluorescent material 70 for wavelength conversion of the light from the light emitting element 10, and a resin also serving as a sealing material. Further, the fluorescent material 70 contains a first fluorescent material 71 and a second fluorescent material 72. The first fluorescent material 71 contains the aluminate fluorescent material (I) according to the first embodiment of the present disclosure. The first lead 20 and the second lead 30 connected to the pair of positive and negative electrodes of the light emitting element 10 are partly exposed toward the outside of the package constituting the light emitting device 100. Via these first lead 20 and second lead 30, the light emitting device 100 receives external power to emit light.

The light emitting element 10 is used as an excitation light source, and preferably has a light emission peak wavelength in a range of 430 nm or more and 485 nm or less. The range of the light emission peak wavelength of the light emitting element 10 is more preferably in a range of 440 nm or more and 480 nm or less, even more preferably in a range of 445 nm or more and 470 nm or less. The aluminate fluorescent material (I) according to the first embodiment of the present disclosure is efficiently excited by the light from the excitation light source having a light emission peak wavelength in a range of 430 nm or more and 485 nm or less, and has a high light emission intensity. By using a fluorescent member containing the aluminate fluorescent material (I), the light emitting device 100 that efficiently converts a wavelength of the light emitted from the light emitting element, and emits mixed-color light of the light emitted from the light emitting element 10 and the light emitted from the fluorescent material 70 containing the aluminate fluorescent material (I), can be provided.

The light emitting element 10 preferably uses, for example, a semiconductor light emitting element using a nitride-based semiconductor ($In_XAl_YGa_{1-X-Y}N$, $0 \leq X$, $0 \leq Y$, $X+Y \leq 1$). By using the semiconductor light emitting element as an excitation light source of the light emitting device, a stable light emitting device having high efficiency, high linearity of output to input, and high mechanical impact resistance can be obtained. The full width at half maximum (FWHM) of the light emission spectrum of the light emitting element 10 may be, for example, 30 nm or less, may be 25 nm or less, or may be 20 nm or less. The full width at half maximum (FWHM) indicates a wavelength width of the light emission peak showing a value of 50% of the maximum light emission peak of the light emission spectra.

The first fluorescent material 71 contains the aluminate fluorescent material (I) according to the first embodiment of the present disclosure, and is contained in the fluorescent member 50 covering the light emitting element 10. In the light emitting device 100 in which the light emitting element 10 is covered by the fluorescent member 50 containing the first fluorescent material 71, a portion of light emitted from the light emitting element 10 is absorbed in the aluminate fluorescent material (I) and is re-emitted as green light. By using the light emitting element 10 configured to emit light having a light emission peak wavelength in a range of 430 nm or more and 485 nm or less, a light emitting device having a high light emission intensity can be provided.

The fluorescent member 50 preferably contains the second fluorescent material 72 whose light emission peak wavelength differs from that of the first fluorescent material 71. For example, the light emitting device 100 is provided with the light emitting element 10 that emits light having a light emission peak wavelength in a range of 430 nm or more and 485 nm or less, and adequately the first fluorescent material 71 and the second fluorescent material 72 to be excited by the light, and consequently, the light emitting device 100 can have a broad color reproducibility range and good color rendering properties.

The second fluorescent material 72 may be any one that absorbs light emitted from the light emitting element 10 and converts the light into light having a wavelength different from that of the first fluorescent material 71. Examples thereof may include $(Ca, Sr, Ba)_2SiO_4:Eu$, $(Ca, Sr, Ba)_8MgSi_4O_{16}(F, Cl, Br)_2:Eu$, $Si_{6-z}Al_zO_zN_{8-z}:Eu$ ($0<z\leq4.2$), $(Sr, Ba, Ca)Ga_2S_4:Eu$, $(Lu, Y, Gd, Lu)_3(Ga, Al)_5O_{12}:Ce$, $(La, Y, Gd)_3Si_6N_{11}:Ce$, $Ca_3Sc_2Si_3O_{12}:Ce$, $CaSc_4O_4:Ce$, $K_2(Si, Ge, Ti)F_6:Mn$, $(Ca, Sr, Ba)_2Si_5N_8:Eu$, $CaAlSiN_3:Eu$, $(Ca, Sr)AlSiN_3:Eu$, $(Sr, Ca)LiAl_3N_4:Eu$, $(Ca, Sr)_2Mg_2Li_2Si_2N_6:Eu$, and $3.5MgO.0.5MgF_2.GeO_2:Mn$.

In the case where the fluorescent member 50 contains the second fluorescent material 72, the second fluorescent material 72 is preferably a red fluorescent material that emits red color light, and preferably absorbs light having a light emission peak wavelength in a range of 430 nm or more and 485 nm or less and emits light having a light emission peak wavelength in a range of 610 nm or more and 780 nm or less. By containing the red fluorescent material in the light emitting device, a light emitting device capable of emitting desired light can be provided in a wide range of fields such as lighting systems and liquid crystal display devices.

Examples of the red fluorescent material may include a Mn-activated fluorescent material having a composition represented by $K_2SiF_6:Mn$ or $3.5MgO.0.5MgF_2.GeO_2:Mn$, and an Eu-activated nitride fluorescent material having a composition represented by $CaSiAlN_3:Eu$, $(Ca, Sr)AlSiN_3:Eu$, or $SrLiAl_3N_4:Eu$. Among these, from the viewpoint of increasing the color purity and broadening the color reproducibility range, the red fluorescent material is preferably a Mn-activated fluoride fluorescent material of which the full width at half maximum of the light emission spectrum is 20 nm or less.

In addition to the fluorescent material 70 containing the first fluorescent material 71 and the second fluorescent material 72, the fluorescent member 50 that covers the light emitting element may include a sealing material. Examples of the sealing material for constituting the fluorescent member 50 may include thermosetting resins such as a silicone resin and an epoxy resin. The amount of the fluorescent material 70 in the fluorescent member composition containing the fluorescent material 70 and the resin is, for example, in a range of 10 parts by mass or more and 200 parts by mass or less with respect to 100 parts by mass of the resin.

Method of Producing Aluminate Fluorescent Material

Next, an exemplary method of producing the aluminate fluorescent material will be described. The method of producing the aluminate fluorescent material (I) is not limited to the following producing method. The aluminate fluorescent material (I) can be produced using compounds containing elements that constitute the composition of the aluminate fluorescent material (I).

Raw Materials Constituting Composition of Aluminate Fluorescent Material (I)

Examples of the raw material constituting the composition of the aluminate fluorescent material (I) may include a compound containing at least one element $X^1$ selected from the group consisting of Ba, Sr, and Ca (hereinafter also referred to as "$X^1$ compound"), a compound containing magnesium (Mg), a compound containing manganese (Mn), a compound containing an aluminum metal, an aluminum alloy, or aluminum (Al), and a compound containing europium (Eu).

Compound Containing Element $X^1$

Examples of the $X^1$ compound may include an oxide, a hydroxide, a carbonate, a nitrate, a sulfate, a carboxylate, a halide, and a nitride, each containing the element $X^1$. These compounds may be in the form of a hydrate. The halide containing the element $X^1$ may also act as a flux. Specifically, the compound may include BaO, $Ba(OH)_2.8H_2O$, $BaCO_3$, $Ba(NO_3)_2$, $BaSO_4$, $Ba(OCO)_2.2H_2O$, $Ba(OCOCH_3)_2$, $BaCl_2.6H_2O$, $Ba_3N_2$, BaNH, SrO, $Sr(OH)_2.8H_2O$, $SrCO_3$, $Sr(NO_3)_2.4H_2O$, $SrSO_4$, $Sr(OCO)_2.H_2O$, $Sr(OCOCH_3)_2.0.5H_2O$, $SrCl_2.6H_2O$, $Sr_3N_2$, SrNH, CaO, $Ca(OH)_2$, $CaCO_3$, $Ca(NO_3)_2$, $CaSO_4$, $Ca(OCO)_2$, $CaCl_2$, $Ca_3N_2$. One alone or two or more of these compounds may be used either singly or in combination. Among these, a carbonate and an oxide are preferred from the viewpoint of easy handleability. The carbonate containing the element $X^1$ is more preferred. Since the stability thereof in air is good, it can be easily decomposed by heating, elements except the intended composition hardly remain, and the light emission intensity can be readily prevented from being lowered by residual impurity elements.

Compound Containing Mg

Examples of the compound containing Mg may include an oxide, a hydroxide, a carbonate, a nitrate, a sulfate, a carboxylate, a halide, and a nitride, each containing Mg. These compounds containing Mg may be in the form of a hydrate. The halide containing Mg also acts as a flux. Specifically, the compound may include MgO, $Mg(OH)_2$, $3MgCO_3.Mg(OH)_2.3H_2O$, $MgCO_3.Mg(OH)_2$, $Mg(NO_3)_2.6H_2O$, $MgSO_4$, $Mg(OCO)_2.H_2O$, $Mg(OCOCH_3)_2.4H_2O$, $MgCl_2$, $Mg_3N_2$. One alone or two or more of the compounds containing Mg may be used either singly or in combination. Among these, a carbonate and an oxide are preferred from the viewpoint of easy handleability. The oxide containing Mg (for example, MgO) and/or the halide also acting as a flux (for example, $MgF_2$) is more preferred. Since the stability thereof in air is good, it can be easily decomposed by heating, elements except the intended composition hardly remain, and the light emission intensity can be readily prevented from being lowered by residual impurity elements.

Compound Containing Mn

Examples of the compound containing Mn may include an oxide, a hydroxide, a carbonate, a nitrate, a sulfate, a carboxylate, a halide, and a nitride, each containing Mn. The halide containing Mn also acts as a flux. These compounds containing Mn may be in the form of a hydrate. Specifically, the compound may include $MnO_2$, $Mn_2O_2$, $Mn_3O_4$, MnO, $Mn(OH)_2$, $MnCO_3$, $Mn(NO_3)_2$, $Mn(OCOCH_3)_2.2H_2O$, $Mn(OCOCH_3)_3.2H_2O$, $MnCl_2.4H_2O$. One alone or two or more of the compounds containing Mn may be used either singly or in combination. Among these, a carbonate and an oxide are preferred from the viewpoint of easy handleability. The carbonate containing Mn (for example, $MnCO_3$) is more preferred. Since the stability thereof in air is good, it can be easily decomposed by heating, elements except the intended composition hardly remain, and the light emission intensity can be readily prevented from being lowered by residual impurity elements.

Compound Containing Eu

Examples of the compound containing Eu may include an oxide, a hydroxide, a carbonate, a nitrate, a sulfate, a halide, and a nitride, each containing Eu. The halide containing Eu also acts as a flux. These compounds containing Eu may be in the form of a hydrate. Specifically, the compound may include EuO, $Eu_2O_3$, $Eu(OH)_3$, $Eu_2(CO_3)_3$, $Eu(NO_3)_3$, $Eu_2(SO_4)_3$, $EuCl_2$, $EuF_3$. One alone or two or more of the compounds containing Eu may be used either singly or in combination. Among these, a carbonate and an oxide are preferred from the viewpoint of easy handleability. The oxide containing Eu (for example, $Eu_2O_3$) is more preferred. Since the stability thereof in air is good, it can be easily decomposed by heating, elements except the intended composition hardly remain, and the light emission intensity can be readily prevented from being lowered by residual impurity elements.

Compound Containing Al Metal, Al Alloy, or Al

Examples of the compound containing Al may include an oxide, a hydroxide, a nitride, an oxynitride, a fluoride, and a chloride, each containing Al. A halide containing Al also acts as a flux. These compounds may be in the form of a hydrate. An aluminum metal or an aluminum alloy may be used. The Al metal or the Al alloy may be used in place of at least a part of the compound.

Specifically, the compound containing Al may include $Al_2O_3$, $Al(OH)_3$, AlN, $AlF_3$, $AlCl_3$. One alone or two or more of the compounds containing Al may be used either singly or in combination. The compound containing Al is preferably an oxide (for example, $Al_2O_3$). This is because, differing from other materials, the oxide does not contain any other element than the intended composition of an aluminate fluorescent material, and a fluorescent material having an intended composition is easy to obtain. In the case of using a compound containing some other element than the intended composition, residual impurity elements may remain in the resultant fluorescent material, the residual impurity elements may be killer elements against light emission, and the light emission intensity may be extremely lowered.

Flux

In order to enhance the reactivity of the raw materials, it is preferable to use a flux. An example of the flux may be a halide. By containing the flux in the raw material mixture, reaction among the raw materials can be promoted and solid-phase reaction can easily progress more uniformly. It could be assumed that this is because a temperature in heat-treating the raw material mixture would be nearly the same as a formation temperature of a liquid phase for the halide to be used as the flux, or would be higher than the formation temperature of the liquid phase, and thus the reaction could be promoted.

Examples of the halide may include fluorides containing at least one metal element selected from the group of consisting of a rare earth metal, an alkaline earth metal, and an alkali metal; chlorides containing at least one metal element selected from the group of consisting of a rare earth metal, an alkaline earth metal, and an alkali metal; and fluorides or chlorides of aluminum. In the case of using the compound containing the element constituting the composition of the aluminate fluorescent material (I) as the flux, the flux may be added as the compound which allows the elemental ratio of positive ions contained in the flux to be the composition of the intended aluminate fluorescent material, or after preparing the raw materials so as to be the composition of the intended aluminate fluorescent material, the flux may be further added thereto.

In the case where the flux contains the element constituting the composition of the aluminate fluorescent material (I), the flux and the other compounds are mixed such that the total of the molar ratio of the element contained in the flux and the molar ratio of the element contained in the compound other than the flux satisfies the composition represented by the formula (I).

In the case where the flux does not contain the element constituting the composition of the aluminate fluorescent material (I), the flux is added after preparing the raw materials so as to be the composition of the intended aluminate fluorescent material (I).

In the case of using a halide containing an alkali metal as the flux, a minute amount of the alkali metal element may be contained in the resultant aluminate fluorescent material. The alkali metal element contained in the aluminate fluorescent material is preferably at least one element selected from the group consisting of Li, K, and Na, more preferably Na.

Specific examples of the flux may include $BaF_2$, $MgF_2$, $CaF_2$, LiF, NaF, KF, and $AlF_3$. The flux is preferably at least one selected from the group consisting of $MgF_2$, NaF, and $AlF_3$, more preferably $MgF_2$ and/or NaF. This is because, by using $MgF_2$ and/or NaF as the flux, the crystal structure is stabilized, and a fluorescent material having a relatively large average particle diameter can be obtained. One alone or two or more of the fluxes may be used either singly or in combination.

In the case where the halide containing an element other than the element constituting the composition of the aluminate fluorescent material (I) is used as the flux, the content of the flux is preferably 10 parts by mass or less, based on the total, which is 100 parts by mass, of the raw materials before containing the flux, more preferably 5 parts by mass or less, even more preferably 2 parts by mass or less, and preferably 0.1 part by mass or more. This is because, when the content of the flux containing an element other than the element constituting the composition of the aluminate fluorescent material (I) falls within the range, difficulty in forming crystal structure owing to shortage of the flux to cause grain growth failure can be avoided, and difficulty in forming crystal structure owing to excessive flux can also be avoided.

Mixing of Raw Materials

The raw materials are weighed so as to be a molar ratio satisfying the composition represented by the formula (I), and then mixed, thereby producing a raw material mixture. The raw materials and/or a halide as the flux may be added to the raw material mixture. The amount of the halide contained in the raw material mixture is preferably 1 mol or less with respect to the total 1 mol of the amount of the element selected from the group consisting of Ba, Ca, and Sr contained in the raw material mixture and the amount of the Eu element, more preferably 0.5 mol or less, even more preferably 0.2 mol or less, and preferably 0.05 mol or more. Here, as to the amount of the flux contained in the raw material mixture, in the case of adding two or more kinds of the halides as two or more kinds of the fluxes, the total molar amount of the two or more kinds of the fluxes preferably falls within the range.

For the raw material mixture, the raw materials may be ground and mixed using a dry-type grinder such as a ball mill, a vibration mill, a hammer mill, a roll mill, or a jet mill; may be ground and mixed using a mortar, a pestle; may be mixed using a mixing machine such as a ribbon blender, a Henschel mixer, or a V-shaped blender; or may be ground and mixed using both the dry-type grinder and the mixing machine. The mixing may be dry-type mixing, or may also be wet-type mixing with a solvent added thereto. The dry-type mixing is preferred. This is because the processing time can be shortened more in the dry-type mixing than in the wet-type mixing, thereby leading to productivity improvement.

Heat Treatment (First Heat Treatment)

The raw material mixture is set in a crucible or a boat formed of carbon material such as graphite, boron nitride (BN), aluminum oxide (alumina), tungsten (W), or molybdenum (Mo), and is then heat-treated, thereby obtaining an aluminate fluorescent material (I). A step of heat treating the raw material mixture is also referred to as a heat treatment or a first heat treatment.

From the viewpoint of stability of the crystal structure, the temperature of the heat treatment (first heat treatment) is preferably 1,000° C. or higher and 1,800° C. or lower, more preferably 1,100° C. or higher and 1,750° C. or lower, even more preferably 1,200° C. or higher and 1,700° C. or lower, still more preferably 1,300° C. or higher and 1,650° C. or lower.

The heat treatment time differs depending on the heating rate, the heat treatment atmosphere. The heat treatment time after reaching at the heat treatment temperature is preferably 1 hour or more, more preferably 2 hours or more, even more preferably 3 hours or more, and preferably 20 hours or less, more preferably 18 hours or less, even more preferably 15 hours or less.

The heat treatment atmosphere may be an inert atmosphere containing argon, nitrogen; a reducing atmosphere containing hydrogen; or an oxidizing atmosphere such as air. The raw material mixture is preferably heat-treated in a reductive nitrogen atmosphere to obtain a fluorescent material. The heat treatment atmosphere for the raw material mixture is more preferably a nitrogen atmosphere containing a reductive hydrogen gas.

The raw material mixture can be more reactive in an atmosphere having a high reducing power such as in a reducing atmosphere containing hydrogen and nitrogen, and can be heat-treated under an atmospheric pressure without pressurization, thereby obtaining an aluminate fluorescent material (I). For the heat treatment, for example, an electric furnace, a gas furnace can be used.

The aluminate fluorescent material (I) may be obtained in such a manner that the resultant aluminate fluorescent material (I) as a seed crystal and further the raw materials are mixed, and the resultant mixture is subjected to a second heat treatment. In the case where the resultant aluminate fluorescent material (I) as a seed crystal is further subjected to a second heat treatment, a step of obtaining the resultant aluminate fluorescent material (I) to be a seed crystal is also referred to as a first heat treatment.

Dispersion Treatment

After the first heat treatment and before the second heat treatment, the first calcined product may be subjected to a dispersion treatment by a step of dispersing that will be described later. In the step of dispersing the first calcined product, the first calcined product may be classified, for example, through wet-type dispersion, wet-type sieving, dehydration, drying, dry-type sieving to obtain an aluminate fluorescent material (I) to be a seed crystal having a desired average particle diameter. As a solvent for the wet-type dispersion, for example, a deionized water may be used. The time for the wet-type dispersion varies depending on the solid dispersion medium or the solvent to be used, but is preferably 30 minutes or more, more preferably 60 minutes or more, even more preferably 90 minutes or more, still more preferably 120 minutes or more, and is preferably 420 minutes or less. When the aluminate fluorescent material (I) to be a seed crystal is wet-dispersed within a range of preferably 30 minutes or more and 420 minutes or less, and when the resultant aluminate fluorescent material is used in a light emitting device, the dispersibility of the fluorescent material in the resin constituting the fluorescent member of the light emitting device can be improved.

Second Heat Treatment

A second heat treatment is performed in such a manner that the aluminate fluorescent material (I) thus obtained in the first heat treatment is used as a seed crystal, and the raw materials are further added to the aluminate fluorescent material (I) to be a seed crystal. A second mixture containing the aluminate fluorescent material (I) obtained in the first heat treatment and the raw materials comprises: a compound containing at least one metal element selected from the group consisting of Ba, Sr, and Ca; at least one compound selected from a compound containing Mn and a compound containing Eu; a compound containing Al; the first calcined product of which the content is 10% by mass or more and 90% by mass or less with respect to the total amount of the second mixture; and optionally a compound containing Mg. The second mixture is subjected to a second heat treatment to obtain an aluminate fluorescent material (I) that is subjected to the second heat treatment. The second mixture preferably comprises a compound containing Eu and a compound containing Mn.

The content of the aluminate fluorescent material (I) to be a seed crystal contained in the second mixture with respect to the total amount of the second mixture is preferably in a range of 15% by mass or more and 85% by mass or less, more preferably in a range of 20% by mass or more and 80% by mass or less, even more preferably in a range of 25% by mass or more and 80% by mass or less, still more preferably in a range of 30% by mass or more and 80% by mass or less. When the aluminate fluorescent material (I) to be a seed crystal is contained in the second mixture in a range of 10% by mass of more and 90% by mass or less with respect to the total amount of the second mixture, the crystal growth can be promoted from the aluminate fluorescent material (I) as a seed crystal, and an aluminate fluorescent material (I) that is subjected to a second heat treatment, in which the average particle diameter measured according to the FSSS method is larger than that of the aluminate fluorescent material (I) used as a seed crystal, can be obtained.

In mixing the second mixture, the mixing method, the mixing machine, and the like exemplified in the case of obtaining the first mixture may be used. The second mixture may be subjected to a heat treatment in a crucible, a boat of the same material as that for use for the raw material mixture.

The second mixture preferably contains a flux, and is subjected to a second heat treatment along with the flux therein to obtain a second calcined product.

For the second heat treatment temperature, the temperature ranges as described above for the first heat treatment temperature can be applied. The second heat treatment temperature may be the same as the first heat treatment temperature mentioned above, or may differ from the latter. For the heat treatment, for example, an electric furnace, a gas furnace can be used.

For the atmosphere for the second heat treatment, the atmospheres as described above for the first heat treatment can be applied. The second heat treatment atmosphere may be the same as the first heat treatment atmosphere, or may differ from the latter.

For the time period for the second heat treatment, the time periods as described above for the first heat treatment can be applied. The second heat treatment time may be the same as the first heat treatment time, or may differ from the latter.

Post Treatment

The resultant fluorescent material may be wet dispersed and subjected to post treatments such as wet-type sieving, dehydration, drying, and dry-type sieving. According to these post treatments, a fluorescent material having a desired average particle diameter can be obtained. For example, the fluorescent material after the heat treatment is dispersed in a solvent; the dispersed fluorescent material is set on a sieve; the solvent flow is allowed to flow while applying a variety of vibrations via the sieve; thereby subjecting the calcined product to mesh passing to achieve wet-type sieving; and subsequently, dehydration, drying, and dry-type sieving are performed. The fluorescent material having a desired average particle diameter can be thus obtained.

By dispersing the fluorescent material after the heat treatment in a medium, impurities such as a calcination residue of the flux and unreacted components of the raw materials can be removed. For the wet-type dispersion, a dispersion medium such as an alumina ball or a zirconia ball may be used.

EXAMPLES

The present invention is hereunder specifically described by reference to the following Examples. However, the present invention is not limited to these Examples.

Example 1

For a fluorescent material having a composition represented by $Ba_{0.999}Eu_{0.0001}Mg_{0.5}Mn_{0.5}Al_{10}O_{17}$, $BaCO_3$, $Eu_2O_3$, MgO, $MnCO_3$, $Al_2O_3$, and $MgF_2$ also acting as a flux were used as raw materials, the raw materials were mixed such that the molar ratio as a charged amount ratio could be Ba:Eu:Mg:Mn:Al=0.999:0.001:0.5:0.5:10, and NaF as a halide acting as a flux was added thereto in addition to $MgF_2$, thereby obtaining a raw material mixture. NaF was added in 0.26 part by mass with respect to the total, which was 100 parts by mass, of the raw materials before adding the flux. The resultant raw material mixture was filled in an alumina crucible and the crucible was closed with a lid. The resultant raw material mixture in the crucible was then subjected to a heat treatment at 1,500° C. for 5 hours in a mixed atmosphere of 3% by volume of $H_2$ and 97% by volume of $N_2$, thereby obtaining an aluminate fluorescent material.

Example 2

An aluminate fluorescent material, as a fluorescent material having a composition represented by $Ba_{0.97}Eu_{0.03}Mg_{0.5}Mn_{0.5}Al_{10}O_{17}$, was obtained in the same manner as in Example 1 except that the raw materials were used such that the molar ratio as a charged amount ratio of each of the raw materials could be Ba:Eu:Mg:Mn:Al=0.97:0.03:0.5:0.5:10.

Example 3

An aluminate fluorescent material, as a fluorescent material having a composition represented by $Ba_{0.95}Eu_{0.05}Mg_{0.5}Mn_{0.5}Al_{10}O_{17}$, was obtained in the same manner as in Example 1 except that the raw materials were used such that the molar ratio as a charged amount ratio of each of the raw materials could be Ba:Eu:Mg:Mn:Al=0.95:0.05:0.5:0.5:10.

Example 4

An aluminate fluorescent material, as a fluorescent material having a composition represented by $Ba_{0.90}Eu_{0.10}Mg_{0.5}Mn_{0.5}Al_{10}O_{17}$, was obtained in the same manner as in Example 1 except that the raw materials were used such that the molar ratio as a charged amount ratio of each of the raw materials could be Ba:Eu:Mg:Mn:Al=0.90:0.10:0.5:0.5:10.

Comparative Example 1

An aluminate fluorescent material, as a fluorescent material having a composition represented by $Ba_{1.0}Mg_{0.8}Mn_{0.2}Al_{10}O_{17}$, was obtained in the same manner as in Example 1 except that the raw materials were used such that the molar ratio as a charged amount ratio of each of the raw materials could be Ba:Mg:Mn:Al=1.0:0.8:0.2:10.

Comparative Example 2

An aluminate fluorescent material, as a fluorescent material having a composition represented by $Ba_{1.0}Mg_{0.5}Mn_{0.5}Al_{10}O_{17}$, was obtained in the same manner as in Example 1 except that the raw materials were used such that the molar ratio as a charged amount ratio of each of the raw materials could be Ba:Mg:Mn:Al=1.0:0.5:0.5:10.

Comparative Example 3

An aluminate fluorescent material, as a fluorescent material having a composition represented by $Ba_{0.70}Eu_{0.30}Mg_{0.5}Mn_{0.5}Al_{10}O_{17}$, was obtained in the same manner as in Example 1 except that the raw materials were used such that the molar ratio as a charged amount ratio of each of the raw materials could be Ba:Eu:Mg:Mn:Al=0.70:0.30:0.5:0.5:10.

Comparative Example 4

An aluminate fluorescent material, as a fluorescent material having a composition represented by $Ba_{0.60}Eu_{0.40}Mg_{0.5}Mn_{0.5}Al_{10}O_{17}$, was obtained in the same manner as in Example 1 except that the raw materials were used such that the molar ratio as a charged amount ratio of each of the raw materials could be Ba:Eu:Mg:Mn:Al=0.60:0.40:0.5:0.5:10.

Comparative Example 5

An aluminate fluorescent material, as a fluorescent material having a composition represented by $Ba_{0.60}Eu_{0.40}Mg_{0.7}Mn_{0.3}Al_{10}O_{17}$, was obtained in the same manner as in Example 1 except that the raw materials were used such that the molar ratio as a charged amount ratio of each of the raw materials could be Ba:Eu:Mg:Mn:Al=0.60:0.40:0.7:0.3:10.

Comparative Example 6

An aluminate fluorescent material, as a fluorescent material having a composition represented by $Ba_{0.60}Eu_{0.40}Mg_{0.8}Mn_{0.2}Al_{10}O_{17}$, was obtained in the same manner as in Example 1 except that the raw materials were used such that the molar ratio as a charged amount ratio of each of the raw materials could be Ba:Eu:Mg:Mn:Al=0.60:0.40:0.8:0.2:10.

Example 5

For a fluorescent material having a composition represented by $Ba_{0.9}Eu_{0.1}Mg_{0.45}Mn_{0.5}Al_{10}O_{16.95}$, $BaCO_3$, $Eu_2O_3$, MgO, $MnCO_3$, $Al_2O_3$, and $MgF_2$ also acting as a flux were used as raw materials, the raw materials were mixed such that the molar ratio as a charged amount ratio could be Ba:Eu:Mg:Mn:Al=0.9:0.1:0.45:0.5:10, and NaF as a halide acting as a flux was added thereto in addition to $MgF_2$, thereby obtaining a raw material mixture. NaF was added in 0.26 part by mass with respect to the total, which was 100 parts by mass, of the raw materials before adding the flux. The resultant raw material mixture was filled in an alumina crucible and the crucible was closed with a lid. The resultant raw material mixture in the crucible was then subjected to a first heat treatment at 1,500° C. for 5 hours in a mixed atmosphere of 3% by volume of $H_2$ and 97% by volume of $N_2$, thereby obtaining an aluminate fluorescent material to be a seed crystal. The resultant aluminate fluorescent material to be a seed crystal was put in a container made of polyethylene to disperse in a deionized water, and was dispersed using an alumina ball as a dispersion medium for 240 minutes. Thereafter, the resultant dispersed aluminate fluorescent material to be a seed crystal was subjected to post treatments in the order of wet-type sieving, classification, dehydration, drying, and dry-type sieving, thereby obtaining an aluminate fluorescent material to be a seed crystal.

In order to obtain a fluorescent material having a composition represented by $Ba_{0.9}Eu_{0.1}Mg_{0.45}Mn_{0.5}Al_{10}O_{16.95}$, the resultant aluminate fluorescent material to be a seed crystal, $BaCO_3$, $Eu_2O_3$, MgO, $MnCO_3$, $Al_2O_3$, and $MgF_2$ also acting as a flux were used as raw materials, and NaF as a halide acting as a flux was added thereto in addition to $MgF_2$, thereby obtaining a second mixture. The second mixture was produced in such a manner that 30% by mass of the aluminate fluorescent material to be a seed crystal was contained in the total amount (100% by mass) of the second mixture. The resultant second mixture was filled in an alumina crucible and the crucible was closed with a lid. The resultant second mixture in the crucible was then subjected to a second heat treatment at 1,500° C. for 5 hours in a mixed atmosphere of 3% by volume of $H_2$ and 97% by volume of $N_2$, thereby obtaining a second heat-treated object. The resultant second heat-treated object was put in a container made of polyethylene to disperse in a deionized water, and was dispersed using an alumina ball as a dispersion medium for 240 minutes. Thereafter, the resultant dispersed second heat-treated object was subjected to post treatments in the order of wet-type sieving, classification, dehydration, drying, and dry-type sieving, thereby obtaining an aluminate fluorescent material.

Example 6

An aluminate fluorescent material, as a fluorescent material having a composition represented by $Ba_{0.875}Eu_{0.125}Mg_{0.45}Mn_{0.5}Al_{10}O_{16.95}$, was obtained in the same manner as in Example 5 except that $BaCO_3$, $Eu_2O_3$, MgO, $MnCO_3$, $Al_2O_3$, and $MgF_2$ also acting as a flux were used as raw materials, and the raw materials were mixed such that the molar ratio as a charged amount ratio could be Ba:Eu:Mg:Mn:Al=0.875:0.125:0.45:0.5:10.

Example 7

An aluminate fluorescent material, as a fluorescent material having a composition represented by $Ba_{0.85}Eu_{0.15}Mg_{0.45}Mn_{0.5}Al_{10}O_{16.95}$, was obtained in the same manner as in Example 5 except that $BaCO_3$, $Eu_2O_3$, MgO, $MnCO_3$, $Al_2O_3$, and $MgF_2$ also acting as a flux were used as raw materials, and the raw materials were mixed such that the molar ratio as a charged amount ratio could be Ba:Eu:Mg:Mn:Al=0.85:0.15:0.45:0.5:10.

Example 8

An aluminate fluorescent material, as a fluorescent material having a composition represented by $Ba_{0.825}Eu_{0.175}Mg_{0.45}Mn_{0.5}Al_{10}O_{16.95}$, was obtained in the same manner as in Example 5 except that $BaCO_3$, $Eu_2O_3$, MgO, $MnCO_3$, $Al_2O_3$, and $MgF_2$ also acting as a flux were used as raw materials, and the raw materials were mixed such that the molar ratio as a charged amount ratio could be Ba:Eu:Mg:Mn:Al=0.825:0.175:0.45:0.5:10.

Example 9

An aluminate fluorescent material, as a fluorescent material having a composition represented by $Ba_{0.8}Eu_{0.2}Mg_{0.45}Mn_{0.5}Al_{10}O_{16.95}$, was obtained in the same manner as in Example 5 except that $BaCO_3$, $Eu_2O_3$, MgO, $MnCO_3$, $Al_2O_3$, and $MgF_2$ also acting as a flux were used as raw materials, and the raw materials were mixed such that the molar ratio as a charged amount ratio could be Ba:Eu:Mg:Mn:Al=0.8:0.2:0.45:0.5:10.

Example 10

An aluminate fluorescent material, as a fluorescent material having a composition represented by $Ba_{0.775}Eu_{0.225}Mg_{0.45}Mn_{0.5}Al_{10}O_{16.95}$, was obtained in the same manner as in Example 5 except that $BaCO_3$, $Eu_2O_3$, MgO, $MnCO_3$, $Al_2O_3$, and $MgF_2$ also acting as a flux were used as raw materials, and the raw materials were mixed such that the molar ratio as a charged amount ratio could be Ba:Eu:Mg:Mn:Al=0.775:0.225:0.45:0.5:10.

Comparative Example 7

An aluminate fluorescent material, as a fluorescent material having a composition represented by $Ba_{1.0}Mg_{0.45}Mn_{0.5}Al_{10}O_{16.95}$, was obtained in the same manner as in Example 5 except that $BaCO_3$, MgO, $MnCO_3$, $Al_2O_3$, and $MgF_2$ also acting as a flux were used as raw materials, and the raw materials were mixed such that the molar ratio as a charged amount ratio could be Ba:Mg:Mn:Al=1.0:0.45:0.5:10.

Light Emitting Device

A light emitting device 100 was produced using the aluminate fluorescent material of each of Examples 5 to 10 and Comparative Example 7 as a first fluorescent material 71. In the light emitting device 100, a nitride semiconductor of which the light emission peak wavelength was 450 nm, was used as a light emitting element 10. A silicone resin was used as a sealing material for constituting a fluorescent member 50. As a second fluorescent material, a manganese-activated fluoride fluorescent material, which emitted a red light, was used. A fluorescent material 70 containing the first fluorescent material 71 and the second fluorescent material 72, in which the blending amount was adjusted such that the chromaticity coordinate of light emitted from the light emitting device was around x=0.262 and y=0.223, was added to the silicone resin. The resultant materials were mixed and dispersed, and thereafter defoamed to obtain a fluorescent member composition for constituting the fluorescent member. The amount (parts by mass) of the fluorescent material 70 with respect to 100 parts by mass of the silicone resin contained in the fluorescent member composition, are shown in Table 2. The fluorescent member composition was injected on the light emitting element 10 located at a concave part of a molded body 40, and filled in the concave part. The resultant article was then heated at 150° C. for 3 hours to cure the fluorescent member composition, and the fluorescent member 50 was formed, thereby producing the light emitting device 100 as shown in FIG. 1.

Average Particle Diameter D

As to the aluminate fluorescent material according to each of Examples and Comparative Examples, using a Fisher Sub-Sieve Sizer Model 95 (manufactured by Fisher Scientific Inc.), the aluminate fluorescent material was sampled in an amount of 1 cm$^3$ in an environment where the temperature was 25° C. and the humidity was 70% RH, and packed in a dedicated tubular container, then a dry air flow was introduced therein under a constant pressure to read a specific surface area of the sample from the differential pressure, and thus a value expressed in terms of the average particle diameter D according to the FSSS method was obtained. The results are shown in Tables 1 and 2.

Volume Average Particle Diameter D50

As to the aluminate fluorescent material according to each of Examples and Comparative Examples, using a laser diffraction particle size distribution measuring apparatus (Mastersizer 3000, manufactured by Malvern Instruments Ltd.), the volume average particle diameter D50 at a cumulative volume frequency of 50% from the small-diameter side was measured. The results are shown in Tables 1 and 2.

Evaluation of Light Emission Characteristics

Light Emission Spectrum

Figure 2:
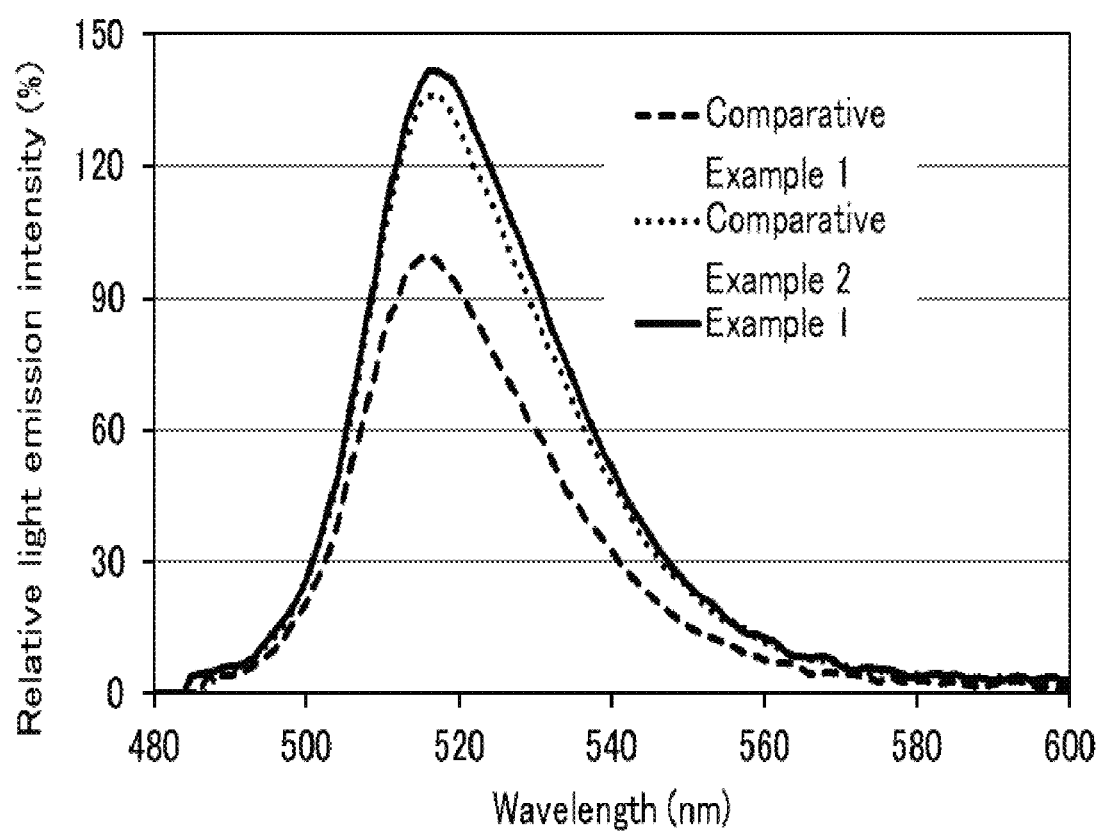
FIG. 2 shows light emission spectra of aluminate fluorescent materials according to Example 1 and Comparative Examples 1 and 2 of the present disclosure.

As to the aluminate fluorescent material according to each of Examples and Comparative Examples, the light emission characteristics thereof were measured. Using a quantum efficiency measuring apparatus (QE-2000, manufactured by Otsuka Electronics Co., Ltd.), each fluorescent material was irradiated with light having an excitation wavelength of 450 nm to measure the light emission spectrum thereof at room temperature (25° C.±5° C.). FIG. 2 shows the light emission spectra of the relative light emission intensity (%) to wavelengths of the aluminate fluorescent materials of Example 1, Comparative Examples 1 and 2.

Relative Light Emission Intensity (%)

As to the aluminate fluorescent material according to each of Examples and Comparative Examples, the relative light emission intensity thereof was calculated from the measured light emission spectrum, when the light emission intensity at the light emission peak wavelength of the aluminate fluorescent material according to Comparative Example 1 was taken as 100%. The results are shown in Tables 1 and 2.

Reflectance (%)

Figure 3:
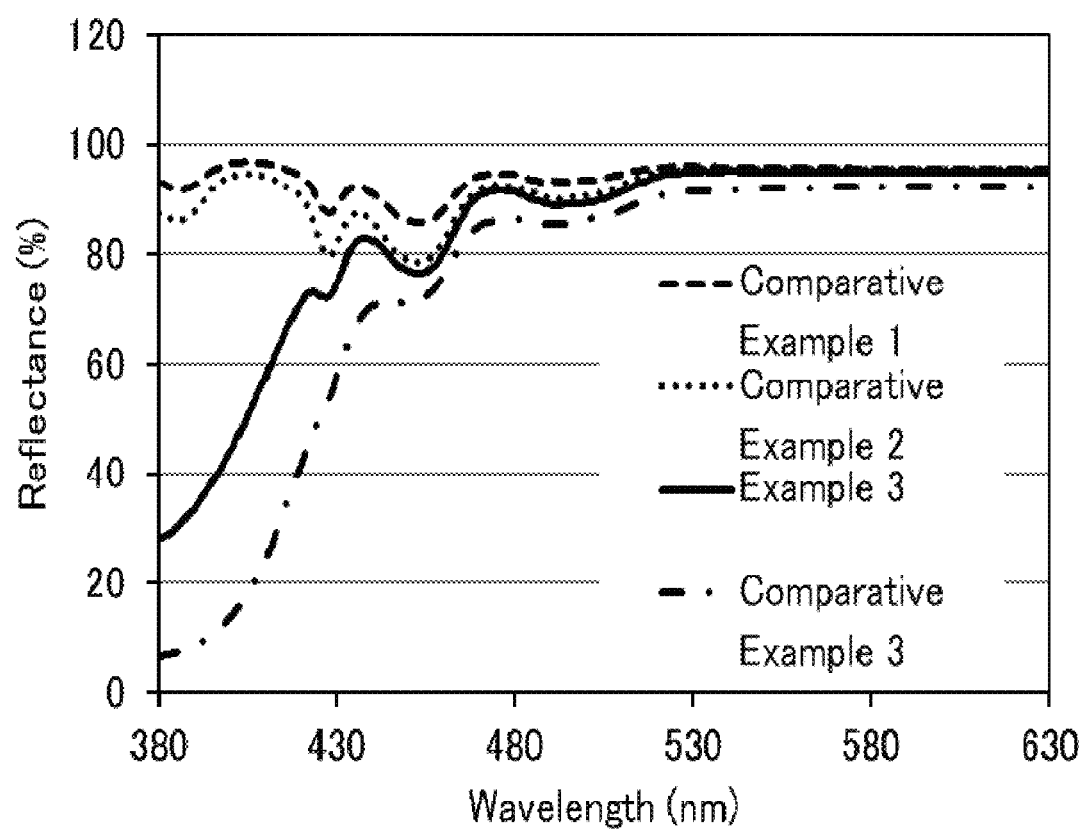
FIG. 3 shows reflection spectra of aluminate fluorescent materials according to Example 3 and Comparative Examples 1 to 3 of the present disclosure.

As to the aluminate fluorescent material according to each of Examples and Comparative Examples, using a fluorospectrophotometer (F-4500, manufactured by Hitachi High-Technologies Corp.), the reflection spectrum thereof was measured at room temperature (25° C.±5° C.) using a calcium hydrogen phosphate ($CaHPO_4$) as a reference sample. The relative intensity in each of the wavelengths of the fluorescent materials, which was obtained from the measured reflection spectrum, was expressed as a reflectance (%), when the intensity of the reflection light of the reference sample in each of the wavelengths was taken as 100%. FIG. 3 shows the reflection spectra of the aluminate fluorescent materials according to Example 3, and Comparative Examples 1 to 3. As to the aluminate fluorescent material according to each of Examples and Comparative Examples, the reflectance (%) at 450 nm, which is an excitation wavelength, and the reflectance (%) at 520 nm, which is the vicinity of the light emission peak wavelength, of the aluminate fluorescent material, are shown in Tables 1 and 2.

SEM Micrograph

Figure 4:
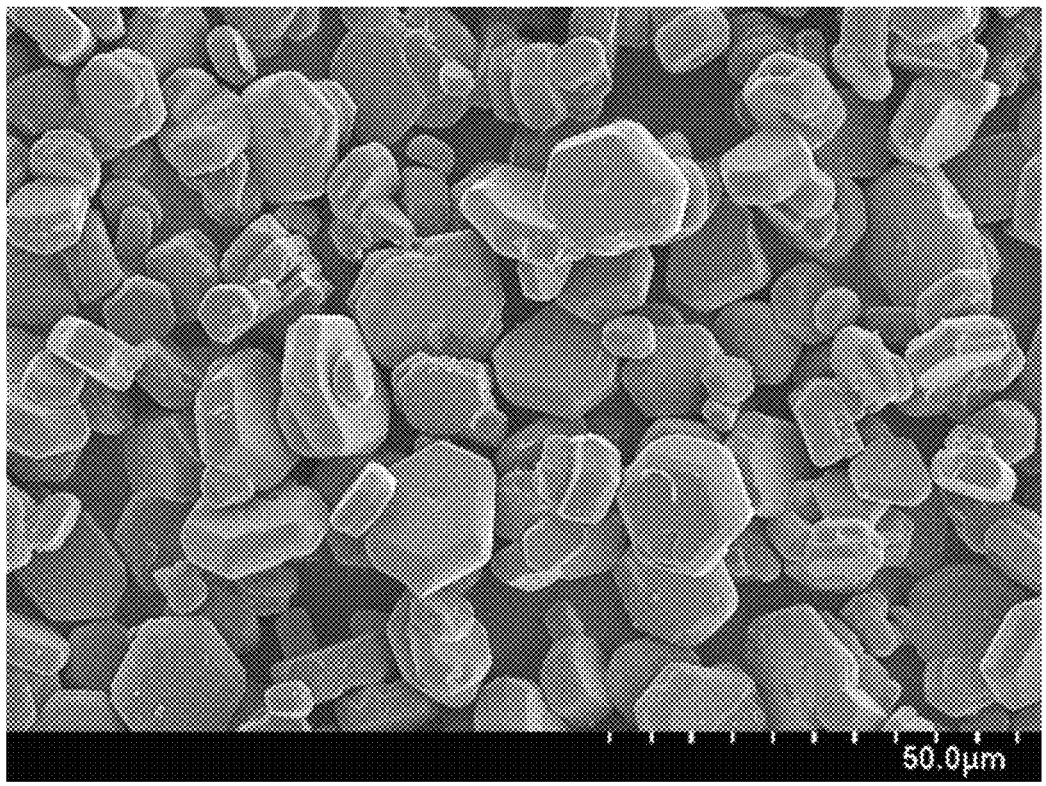
FIG. 4 is a SEM micrograph showing an aluminate fluorescent material according to Example 1 of the present disclosure.
Figure 5:
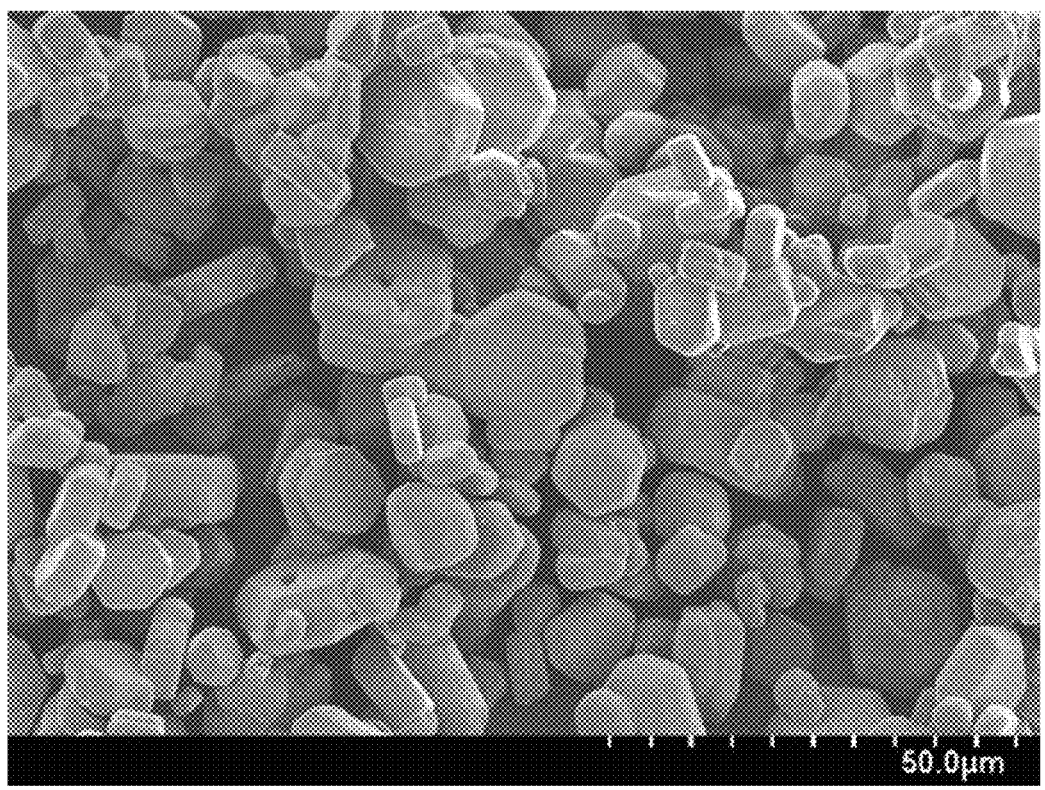
FIG. 5 is a SEM micrograph showing an aluminate fluorescent material according to Comparative Example 1 of the present disclosure.

Using a scanning electron microscope (SEM), SEM micrographs of the aluminate fluorescent materials of Examples and the aluminate fluorescent materials of Comparative Examples were obtained. FIG. 4 is a SEM micrograph showing the aluminate fluorescent material according to Example 1, and FIG. 5 is a SEM micrograph showing the aluminate fluorescent material according to Comparative Example 1.

TABLE 1

| | Composition (molar ratio) | | | | Average particle diameter | Volume average particle diameter | Relative light emission | Reflectance (%) | |
|---|---|---|---|---|---|---|---|---|---|
| | Ba Para. p | Eu Para. t | Mg Para. q | Mn Para. r | (μm) D | (μm) D50 | intensity (%) | 450 nm | 520 nm |
| Comparative Example 1 | 1.000 | 0.000 | 0.80 | 0.20 | 10.8 | 17.1 | 100.0 | 86.1 | 95.8 |
| Comparative Example 2 | 1.000 | 0.000 | 0.50 | 0.50 | 10.6 | 16.2 | 136.0 | 78.9 | 94.8 |
| Example 1 | 0.999 | 0.001 | | | 10.6 | 16.0 | 141.6 | 79.1 | 94.6 |
| Example 2 | 0.970 | 0.030 | | | 11.6 | 17.7 | 142.1 | 76.2 | 92.6 |
| Example 3 | 0.950 | 0.050 | | | 12.0 | 17.7 | 152.3 | 76.9 | 94.1 |
| Example 4 | 0.900 | 0.100 | | | 11.2 | 17.3 | 144.6 | 77.3 | 93.7 |
| Comparative Example 3 | 0.700 | 0.300 | | | 13.4 | 21.7 | 105.2 | 71.0 | 90.5 |
| Comparative Example 4 | 0.600 | 0.400 | | | 12.0 | 20.2 | 58.3 | 72.3 | 76.3 |
| Comparative Example 5 | | | 0.70 | 0.30 | 11.2 | 21.6 | 98.9 | 80.7 | 91.2 |
| Comparative Example 6 | | | 0.80 | 0.20 | 11.8 | 22.8 | 65.9 | 75.3 | 80.1 |

As shown in Table 1, in each of the aluminate fluorescent materials according to Examples 1 to 4, the reflectance at 450 nm was lower than that of the aluminate fluorescent material in Comparative Example 1, the absorption of the excitation light in the blue region increased, and the relative light emission intensity became higher. It is presumed that when each of the aluminate fluorescent materials according to Examples 1 to 4, which contained both Eu and Mn, was excited with light in the blue region by the co-activation of Eu and Mn, the light absorption increased by Eu, the excitation energy was efficiently transmitted from Eu to Mn, and the relative light emission intensity became higher.

As shown in Table 1, in each of the aluminate fluorescent materials according to Examples 1 to 4, the reflectance at the vicinity of the light emission peak wavelength, which was at 520 nm, was 92% or more, and thus the self-absorption was low.

On the other hand, since the aluminate fluorescent material according to Comparative Example 2 did not contain Eu, the light absorption in the blue region by Eu was not performed, and the relative light emission intensity was not as high as those of the aluminate fluorescent materials according to Examples 1 to 4.

In each of the aluminate fluorescent materials according to Comparative Examples 3 and 4, the parameter t, which represented the molar ratio of Eu in the formula (I), was 0.3 or more. The absorbed amount in the blue region was increased since the reflectance at 450 nm was low, but the total amount of Eu and Mn, each acting as an activator, was large, and the relative light emission intensity was decreased by the concentration quenching.

In the aluminate fluorescent material according to Comparative Example 5, the parameter t, which represented the molar ratio of Eu in the formula (I), was larger than 0.3. It is presumed that the relative light emission intensity was decreased since the reflectance at 450 nm was relatively high and the absorbed amount at 450 nm as excitation light was decreased. In the aluminate fluorescent material according to As shown in FIG. 2, it can be confirmed that the peak wavelength of the light emission spectrum of the aluminate fluorescent material according to Example 1 does not shift, as compared with the peak wavelength of the light emission spectrum of the aluminate fluorescent material according to Comparative Example 1, and the relative light emission intensity of the aluminate fluorescent material according to Example 1 is higher than those of the aluminate fluorescent material according to Comparative Example 1 and Comparative Example 2.

As shown in FIG. 3, it can be confirmed that, in the aluminate fluorescent material according to Example 3, the reflectance thereof is lower than that of the aluminate fluorescent material according to Comparative Example 1 in a wavelength range of 430 nm or more and 485 nm or less, and the light from the excitation light source can be efficiently absorbed. Further, as shown in FIG. 3, the reflectance at the light emission peak wavelength of 520 nm in the aluminate fluorescent material according to Example 3 is nearly equal to that in Comparative Example 2.

On the other hand, as shown in FIG. 3, in the aluminate fluorescent material according to Comparative Example 3, the reflectance in a wavelength range of 430 nm or more and 485 nm or less is lower than that of the aluminate fluorescent material according to Comparative Example 1, but the reflectance at the light emission peak wavelength of 520 nm is lower than that of the aluminate fluorescent material according to Example 3.

As shown in the SEM micrographs of FIG. 4 and FIG. 5, it is confirmed that the aluminate fluorescent materials according to Example 1 and Comparative Example 1 include a tabular crystal having at least one hexagonal face and showing a hexagonal crystal structure, and there is no significant difference between the aluminate fluorescent material according to Example 1 and the aluminate fluorescent material according to Comparative Example 1 in appearance of the particle shape.

TABLE 2

| | Composition (molar ratio) | | | | Average particle diameter | Volume average particle diameter | Relative light emission | Reflectance (%) | | Fluorescent material/ resin |
|---|---|---|---|---|---|---|---|---|---|---|
| | Ba Para. p | Eu Para. t | Mg Para. q | Mn Para. r | (μm) D | (μm) D50 | intensity (%) | 450 nm | 520 nm | (parts by mass) |
| Comparative Example 7 | 1.000 | 0.000 | 0.45 | 0.50 | 18.5 | 24.1 | 100.0 | 73.7 | 93.5 | 141.3 |
| Example 5 | 0.900 | 0.100 | | | 18.5 | 24.9 | 99.4 | 69.7 | 90.1 | 115.1 |
| Example 6 | 0.875 | 0.125 | | | 18.0 | 25.0 | 100.0 | 71.2 | 91.6 | 112.2 |
| Example 7 | 0.850 | 0.150 | | | 17.0 | 24.3 | 97.5 | 71.5 | 91.2 | 96.6 |
| Example 8 | 0.825 | 0.175 | | | 17.0 | 25.1 | 99.4 | 71.1 | 91.2 | 101.8 |
| Example 9 | 0.800 | 0.200 | | | 17.0 | 26.6 | 100.6 | 69.5 | 90.4 | 101.5 |
| Example 10 | 0.775 | 0.225 | | | 17.5 | 26.8 | 99.7 | 68.9 | 90.5 | 100.8 |

Comparative Example 6, the parameter t, which represented the molar ratio of Eu in the formula (I), was larger than 0.3, and the parameter r, which represented the molar ratio of Mn, was 0.4 or less. It is presumed that the light absorption by Eu and the transmission of the excitation energy from Eu to Mn were not efficiently performed, and thus the light emission intensity was decreased.

In each of Comparative Examples 4 and 6, the reflectance at the vicinity of the light emission peak wavelength, that is, at 520 nm, was lower than 92%. It is presumed that the self-absorption caused by the aluminate fluorescent material itself was high.

As shown in Table 2, in each of the aluminate fluorescent materials according to Examples 5 to 10, the reflectance at 450 nm was lower than that of the aluminate fluorescent material in Comparative Example 7, and the absorption of the excitation light in the blue region increased. As shown in Table 2, in each of the aluminate fluorescent materials according to Examples 5 to 10, the absorption of the excitation light emitted from the light emitting element in the blue region increased, and the wavelength could be efficiently converted. Accordingly, the amount of the fluorescent material contained in the fluorescent member becomes small, and the light emitting device can be downsized.

The light emitting device using the aluminate fluorescent material according to the embodiment of the present disclosure has a high light emission intensity through photoexcitation in the blue region, and can be used in a broad field of ordinary lightings, in-car lightings, displays, backlights for liquid-crystal devices, traffic lights, illumination-type switches, etc.

The invention claimed is:
1. An aluminate fluorescent material, comprising:
an element $X^1$ that contains at least one element selected from the group consisting of Ba, Sr, and Ca;
Eu,
Mn,
Al,
O, and
optionally Mg, wherein:
in a composition of the aluminate fluorescent material, a molar ratio of the element $X^1$ is a parameter p, a molar ratio of the Mg is a parameter q, a molar ratio of the Mn is a parameter r, a molar ratio of the Al is a parameter s, and a molar ratio of the Eu is a parameter t, and:
p, q, r, s, and t satisfy the following requirements (1) to (7):
$0.5 \leq p \leq 1.0$ (1),
$0 \leq q < 0.6$ (2),
$0.4 < r \leq 0.7$ (3),
$8.5 \leq s \leq 13.0$ (4),
$0.001 \leq t \leq 0.100$ (5),
$0.501 \leq p+t \leq 1.1$ (6), and
$0.4 < q+r \leq 1.1$ (7).

2. The aluminate fluorescent material according to claim 1, wherein the element $X^1$ comprises Ba.

3. The aluminate fluorescent material according to claim 1, wherein r satisfies $0.45 \leq r \leq 0.65$.

4. The aluminate fluorescent material according to claim 1, wherein r and t satisfy $0.4 < r+t < 0.8$.

5. The aluminate fluorescent material according to claim 1, wherein a volume average particle diameter D50 of the aluminate fluorescent material, which is measured according to a laser diffraction particle size distribution measuring method, is 10 µm or more.

6. A light emitting device, comprising:
a fluorescent member comprising the aluminate fluorescent material according to claim 1; and
an excitation light source wherein the excitation light source has a light emission peak wavelength in a range of 430 nm or more and 485 nm or less.

7. The light emitting device according to claim 6, wherein the fluorescent member comprising a first fluorescent material including the aluminate fluorescent material according to claim 1; and
a second fluorescent material emitting light having a light emission peak wavelength in a range of 610 nm or more and 780 nm or less absorbing the light of the excitation light source.

8. A method for producing an aluminate fluorescent material, comprising:
preparing a raw material mixture by mixing a compound containing at least one element $X^1$ selected from the group consisting of Ba, Sr and Ca; a compound containing Eu, a compound containing Mn, and a compound containing Al at least containing an oxide, and optionally a compound containing Mg; and heat treating the raw material mixture to obtain the aluminate fluorescent material wherein
in a composition of the aluminate fluorescent material, a molar ratio of the element $X^1$ is a parameter p, a molar ratio of the Mg is a parameter q, a molar ratio of the Mn is a parameter r, a molar ratio of the Al is a parameter s, and a molar ratio of the Eu is a parameter t, and:
p, q, r, s, and t each satisfy the following requirements (1) to (7):
$0.5 \leq p \leq 1.0$ (1),
$0 \leq q < 0.6$ (2),
$0.4 < r \leq 0.7$ (3),
$8.5 \leq s \leq 13.0$ (4),
$0.001 \leq t \leq 0.100$ (5),
$0.501 \leq p+t \leq 1.1$ (6), and
$0.4 < q+r \leq 1.1$ (7).

9. The method for producing an aluminate fluorescent material according to claim 8, wherein a temperature of the heat treating is in a range of 1,000° C. or higher to 1,800° C. or lower.

10. The method for producing an aluminate fluorescent material according to claim 8, wherein the raw mixture comprises at least one selected from the group consisting of $MgF_2$, NaF, and $AlF_3$.

11. The method for producing an aluminate fluorescent material according to claim 8, wherein the aluminate fluorescent material has a composition represented by the following formula (I):

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q < 0.6$, $0.4 < r \leq 0.7$, $8.5 \leq s \leq 13.0$, $0.001 \leq t \leq 0.100$, $0.501 \leq p+t \leq 1.1$, and $0.4 < q+r \leq 1.1$.

12. A method for producing an aluminate fluorescent material, comprising;
preparing a first mixture by mixing a compound containing at least one element $X^1$ selected from the group consisting of Ba, Sr and Ca, a compound containing Eu, a compound containing Mn, and a compound containing Al at least containing an oxide, and optionally a compound containing Mg,
first heat treating the first mixture to obtain a first aluminate fluorescent material to be a seed crystal,
preparing a second mixture by mixing the first aluminate fluorescent material to be a seed crystal, a compound containing at least one element $X^1$ selected from the group consisting of Ba, Sr and Ca, a compound containing Eu, a compound containing Mn, and a compound containing Al at least containing an oxide, and optionally a compound containing Mg; and
second heat treating the second mixture to obtain a second aluminate fluorescent material, wherein in a composition of the first aluminate fluorescent material a molar ratio of the element $X^1$ is a parameter p, a molar ratio of the Mg is a parameter q, a molar ratio of the Mn is a parameter r, a molar ratio of the Al is a parameter s, and a molar ratio of the Eu is a parameter t, and:
p, q, r, s, and t satisfy the following requirements (I) to (7):
$0.5 < p < 1.0$ (1),
$0 < q < 0.6$ (2),
$0.4 < r < 0.7$ (3),
$8.5 < s < 13.0$ (4),
$0.001 < t < 0.100$ (5),
$0.501 < p+t < 1.1$ (6), and
$0.4 < q+r \leq 1.1$ (7).

13. The method for producing an aluminate fluorescent material according to claim 12, wherein in a composition of the second aluminate fluorescent material, a molar ratio of the element $X^1$ is a parameter p, a molar ratio of the Mg is a parameter q, a molar ratio of the Mn is a parameter r, a molar ratio of the Al is a parameter s, and a molar ratio of the Eu is a parameter t, and:

p, q, r, s, and t satisfy the following requirements (1) to (7):
0.5≤p≤1.0 (1),
0≤q<0.6 (2),
0.4<r≤0.7 (3),
8.5≤s≤13.0 (4),
0.001≤t≤0.100 (5),
0.501≤p+t≤1.1 (6), and
0.4<q+r≤1.1 (7).

14. The method for producing an aluminate fluorescent material according to claim 12, wherein a content of the first fluorescent material to be a seed crystal in the second mixture is in a range of 10% by mass or more and 90% by mass or less.

15. The method for producing an aluminate fluorescent material according to claim 12, wherein a temperature of the first heat treating and/or the second heat treating is in a range of 1,000° C. or higher to 1,800° C. or lower.

16. The method for producing an aluminate fluorescent material according to claim 12, wherein the first mixture and/or the second mixture comprises at least one selected from the group consisting of $MgF_2$, NaF, and $AlF_3$.

17. The method for producing an aluminate fluorescent material according to claim 12, wherein the first aluminate fluorescent material has a composition represented by the following formula (I):

 (I)

wherein $X^1$ represents at least one element selected from the group consisting of Ba, Sr, and Ca; and p, q, r, s, and t each satisfy 0.5≤p≤1.0, 0≤q<0.6, 0.4<r≤0.7, 8.5≤s≤13.0, 0.001≤t≤0.100, 0.501≤p+t≤1.1, and 0.4<q+r≤1.1.

18. The method for producing an aluminate fluorescent material according to claim 12, wherein the second fluorescent material has a composition represented by the following formula (I):

 (I)

wherein $X^1$ represents at least one element selected from the group consisting of Ba, Sr, and Ca; and p, q, r, s, and t each satisfy 0.5≤p≤1.0, 0≤q<0.6, 0.4<r≤0.7, 8.5≤s≤13.0, 0.001≤t≤0.100, 0.501≤p+t≤1.1, and 0.4<q+r≤1.1.

* * * * *